United States Patent
Barabash et al.

(10) Patent No.: US 9,455,073 B2
(45) Date of Patent: Sep. 27, 2016

(54) SUPERCONDUCTING CIRCUITS WITH REDUCED MICROWAVE ABSORPTION

(71) Applicants: Intermolecular, Inc., San Jose, CA (US); Northrop Grumman Systems Corporation, Falls Church, VA (US)

(72) Inventors: Sergey Barabash, San Jose, CA (US); Dipankar Pramanik, Saratoga, CA (US); Andrew Steinbach, San Jose, CA (US); Chris Kirby, Gambrills, MD (US)

(73) Assignees: Intermolecular, Inc., San Jose, CA (US); Northrop Grumman Systems Corporation, Falls Church, VA (US)

( * ) Notice: Subject to any disclaimer, the term of this patent is extended or adjusted under 35 U.S.C. 154(b) by 143 days.

(21) Appl. No.: 14/259,455

(22) Filed: Apr. 23, 2014

(65) Prior Publication Data

US 2015/0313046 A1    Oct. 29, 2015

(51) Int. Cl.
*H01B 12/02* (2006.01)
*H01L 39/24* (2006.01)
*H01L 39/22* (2006.01)

(52) U.S. Cl.
CPC .............. *H01B 12/02* (2013.01); *H01L 39/22* (2013.01); *H01L 39/24* (2013.01); *Y10S 505/704* (2013.01); *Y10S 505/706* (2013.01)

(58) Field of Classification Search
CPC ...... H01B 12/00; H01B 12/02; H01B 12/10; Y10S 505/704; Y10S 505/706
See application file for complete search history.

(56) References Cited

U.S. PATENT DOCUMENTS

| | | | | |
|---|---|---|---|---|
| 5,878,334 A | * | 3/1999 | Talisa et al. | 455/217 |
| 2003/0048171 A1 | * | 3/2003 | Kormanyos | 338/100 |

OTHER PUBLICATIONS

Burin et al.; Universal Dielectric Loss in Glass from Simultaneous Bias and Microwave Fields; Apr. 8, 2013; Physical Review Letters; American Physical Society; pp. 157002-1-157002-5.

* cited by examiner

*Primary Examiner* — Jeremy C Norris

(57) ABSTRACT

Provided are superconducting circuits, methods of operating these superconducting circuits, and methods of determining processing conditions for operating these superconducting circuits. A superconducting circuit includes a superconducting element, a conducting element, and a dielectric element disposed between the superconducting element and the conducting element. The conducting element may be another superconducting element, a resonating element, or a conducting casing. During operation of the superconducting element a direct current (DC) voltage is applied between the superconducting element and the conducting element. This application of the DC voltage reduces average microwave absorption of the dielectric element. In some embodiments, when the DC voltage is first applied, the microwave absorption may initially rise and then fall below the no-voltage absorption level. The DC voltage level may be determined by testing the superconducting circuit at different DC voltage levels and selecting the one with the lowest microwave absorption.

20 Claims, 4 Drawing Sheets

SUPERCONDUCTING CIRCUITS WITH REDUCED MICROWAVE ABSORPTION

BACKGROUND

Superconducting circuits may include wires made of superconducting materials or, simply, superconductors. Other components of the superconducting circuits may include dielectrics. Often, the dielectrics act as sources of microwave absorption, which are believed to be caused by defects and/or two-level systems (TLSs). Optimizing dielectric materials and processing conditions during fabrication of the dielectrics may reduce the number of defects and TLSs. However, precise controlling the dielectric materials and processing conditions can be expensive and some defects and TLSs generally remain and still cause microwave absorption even with precise control.

SUMMARY

Provided are superconducting circuits, methods of operating these superconducting circuits, and methods of determining processing conditions for operating thereof. A superconducting circuit includes a superconducting element, a conducting element, and a dielectric element disposed between the superconducting element and the conducting element. The conducting element may be another superconducting element, a resonating element, or a conducting casing. During operation of the superconducting element a direct current (DC) voltage is applied between the superconducting element and the conducting element. This application of a particular DC voltage reduces average microwave absorption of the dielectric element in comparison to not applying any DC voltage, which may be referred as a microwave absorption level with any bias or, simply, a no-bias level. In some embodiments, when the DC voltage is first applied, the microwave absorption may initially rise above the no-bias level and then fall below the no-bias level. The DC voltage level may be determined by testing the superconducting circuit at different DC voltage levels and selecting the one with the lowest microwave absorption. This lowest microwave absorption may be substantially lower than the no-bias level.

In some embodiments, a method of operating a superconducting circuit involves providing the superconducting circuit that includes a superconducting element, a conducting element, and a dielectric element. The dielectric element is disposed between the superconducting element and the conducting element. In some embodiments, the dielectric element may directly interface one or both of the superconducting element and the conducting element. The dielectric element may include various structural defects that normally would cause microwave absorption when no bias is applied across the dielectric element. The method proceeds with applying a DC voltage between the superconducting element and the conducting element, e.g., while operating the superconducting circuit. Applying the DC voltage reduces average microwave absorption of the dielectric element during operating the superconducting circuit below the no-bias level at least after some period of time after applying the DC voltage. In some embodiments, applying the DC voltage initially increases the microwave absorption of the dielectric element (i.e., above the no-bias level) during operating the superconducting circuit. However, the microwave absorption then drops below the no-bias level.

In some embodiments, the magnitude of the DC voltage is selected based on a type of the structural defects and/or distribution of the structural defects and of the tunneling TLSs within the dielectric element. For example, the structural defects may create electronic defect states at the energy around and above the superconducting gap (and the Fermi level) of the electrode, and be concentrated away from the interface with the superconducting elements. By applying the DC voltage with positive polarity at the superconducting electrode, the energies of the electronic defect states can be further raised and brought away from the range of energies corresponding to the Fermi energy and the superconducting gap. This can eliminate the contribution of these defect states to the absorption at the microwave frequencies. Alternatively, the structural defects may be uniformly distributed within the dielectric element, and further the structural defects may create electronic defect states in a narrow energy range that is pinned to the Fermi energy of the electrode, such that some electronic defect states have the energy inside the superconducting gap. By applying the DC voltage of different polarities, the energies of the defects can be either raised or lowered by the amount depending on the distance to the electrode, so that the energies of most defects, except the defects very close to the electrode, are brought away from the range of energies corresponding to the Fermi energy and to the superconducting gap. This can eliminate the contribution of most of the electronic defect states to the absorption at the microwave frequencies. In this case when the structural defects may be concentrated at the interface with the superconducting elements, the effect of the applied DC voltage on the microwave absorption by electronic defect states can be relatively small. Examples of structural defects include impurities, coordination defects such as under-coordinated ("dangling bond") and over-coordinated ("floating bond") atoms, strained bonds with angles substantially deviating from the ideal values, and "weak bond" configurations in which the distance between two bonding atoms exceeds the ideal bond length.

The optimal polarity and value of the applied DC voltage can depend on more than one factor. For example, in addition to the electronic defect states, TLSs may also contribute to the microwave absorption due to atomic tunneling, such as due to tunneling of hydrogen impurities. The applied DC voltage can modify the absorption from a tunneling TLS irrespective of the distance of TLS from the interface by creating a DC electric field that modifies the level splitting of the TLS. However, similar to the case of the electronic defect states, the applied DC voltage can also modify the TLS contribution depending on the distance of the TLSs from the interface, e.g., by changing the charge state of the TLS thereby making TLS inactive. Further, more than one type of structural defects can be present, such that different types of defects create electronic states at different energies, and the spatial distribution can be different for different defects, depending on forming conditions such as deposition method and annealing history. For example, some type of defects can be concentrated away from the interface with the superconducting elements, because the defects near the interface can have high chemical reactivity and self-passivate by forming chemical bonds to the superconducting material.

In some embodiments, the DC voltage is applied prior to operating the superconducting circuit. For example, a system controller used to operate the superconducting circuit may be also used to apply and remove the DC voltage between the superconducting element and the conducting element. This system controller may determine timing of various operations. Alternatively, the DC voltage is applied after operation the superconducting circuit has been initiated. In some embodiments, some DC voltage may already be required for the functional operation of the superconducting circuit. However, the magnitude of the DC voltage is selected according to the procedure described herein. The conducting element may be one of an additional superconducting element, a resonating element, or a conducting casing. For example, a superconducting circuit may include two superconducting element and a dielectric element disposed between these two superconducting elements. Alternatively, the conducting element may be a conducting casing that is, for example, grounded.

In some embodiments, the dielectric element includes one of amorphous silicon, silicon oxide or aluminum oxide. Other suitable dielectric materials may be used as well. The DC voltage applied between the superconducting element and the conducting element may be between about 0.005 Volts and 5 Volts, or more specifically between 0.1 Volts and 0.5 Volts. The dielectric element may have a thickness of between about 30 nm and 10 mm. In some embodiments, the conducting element is grounded.

Provided also is a superconducting circuit including a superconducting element, a conducting element, a dielectric element, and a voltage controller. The dielectric element is disposed between the superconducting element and the conducting element. The dielectric element includes structural defects, such as impurities, coordination defects, strained bonds and weak bonds, as well as tunneling TLSs such as due to tunneling of hydrogen impurities. The voltage controller is configured to apply a DC voltage between the superconducting element and the conducting element when the superconducting element is operating. The voltage controller may be communicatively coupled to a superconducting circuit controller. The superconducting circuit controller is responsible for controlling operations of the entire superconducting circuit, such as timing of various operations. In some embodiments, the conducting element includes one of an additional superconducting element, a resonating element, or a conducting casing. The dielectric element may include amorphous silicon, silicon oxide or aluminum oxide.

Also provided is a method of determining processing conditions for operating a superconducting circuit. The method may involve providing the superconducting circuit including a superconducting element, a conducting element, and a dielectric element. The dielectric element is disposed between the superconducting element and the conducting element. The dielectric element includes structural defects. The method may proceeds with applying a DC voltage between the superconducting element and the conducting element, e.g., while operating the superconducting circuit. The method may proceed with determining a level of microwave absorption by the dielectric element corresponding to the applied DC voltage. In some embodiments, applying the DC voltage and determining the level of microwave absorption operations are repeated for at least one other DC voltage. Finally, the method may involve selecting the DC voltage corresponding to the lowest level of microwave absorption. In some embodiments, the method also involves comparing the lowest level of microwave absorption to the level of microwave absorption without any DC voltage between the superconducting element and the conducting element, i.e., the no-bias level. The level of microwave absorption may be a timed averaged of microwave absorption to accommodate for initial fluctuations of the microwave absorption.

These and other embodiments are described further below with reference to the figures.

DETAILED DESCRIPTION OF EXAMPLE EMBODIMENTS

Figure 1A:
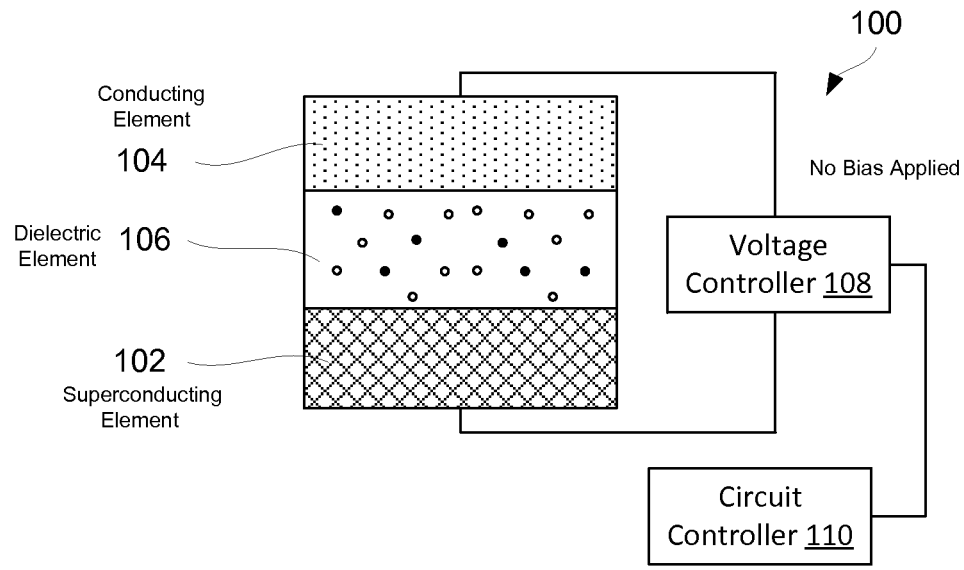
FIGS. 1A and 1B are schematic representations of a superconducting circuit including a superconducting element, a conducting element, a dielectric element disposed between the superconducting element and the conducting element, and a voltage controller configured to apply a DC voltage between the superconducting element and the conducting element, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

As described above, dielectrics in superconducting circuits may act as sources of microwave absorption because of various structural defects present in these dielectrics. This microwave absorption is undesirable as it adds to power losses during operation of the superconducting circuits. In general, the microwave absorption should be minimized. Some reduction in microwave absorption may be achieved using specific dielectric materials and processing conditions in order to reduce the number of defects and TLSs responsible for the absorption. However, these approaches can be expensive and can yield less than the desired degree of improvement.

Provided are superconducting circuits in which a DC voltage is applied between the superconducting element and a conducting element located across the dielectric from the superconducting element. This DC voltage creates an additional electrical potential gradient inside the dielectric element disposed between the superconducting element and the conducting element. As such, the entire superconducting circuit is maintained at a different voltage than the portion of the dielectric most responsible for the absorption. This approach is applicable, for example, to circuits with absorption in a dielectric surrounding the superconducting element or circuits with absorption in a dielectric separating two parts of a superconducting circuit (e.g., the two parts may be two superconducting elements). In the former case, the superconducting element and its surrounding dielectric element may, for example, be surrounded by an additional conducting casing, which may be referred to as a conducting element. The DC voltage is applied between the superconducting element and this casing. In the latter case, the DC voltage may be applied (in addition to any electrical signal that may already exist) between the two superconducting elements, either one of which may serve as a "conducting element" for the purpose of applying the bias voltage. In another example, a superconducting microwave-frequency signal line may be shielded by a ground plane. In this example, the DC voltage is applied between the signal line, which is effective a superconducting element, and the ground plane, which is effectively a conducting element.

Without being restricted to any particular theory, it is believed that the applied DC voltage can have the strongest effect in superconducting circuits having a dielectric element with defects concentrated at a small but finite distance from the dielectric interface with the superconducting element. In this case, the microwave-frequency electromagnetic field couples strongly to the electronic defect levels, whereas the energy of the defect levels is affected substantially by the applied DC voltage. Away from the interface with the superconducting element, the intensity of the microwave field can decrease, whereas very close to the interface, the DC field only affects the TLS absorption and does not substantially change the energy of the defect levels. In some embodiments, however, such as in some designs of microwave wave guides and resonators, the microwave-frequency electromagnetic field can be distributed throughout the thickness of the dielectric. In this case, the applied DC voltage can have the strongest effect in circuits having a dielectric element with defects concentrated far away from the interface or uniformly throughout the thickness of the dielectric. The magnitude of the optimal DC voltage may be determined empirically for each particular superconducting circuit or, more generally, for a particular processing sequence producing similar components of superconducting circuits. For example, the magnitude of the DC voltage may be determined for each production line. The voltage should be sufficient to substantially change the microwave absorption, e.g. such that to bring the typical range of the defect energies substantially out of alignment with the Fermi level and the superconducting gap of the electrode. At the same time, the voltage should not be too large so as not to cause unwanted effects such as tunneling leakage currents or degradation of the dielectric material.

Figure 2:
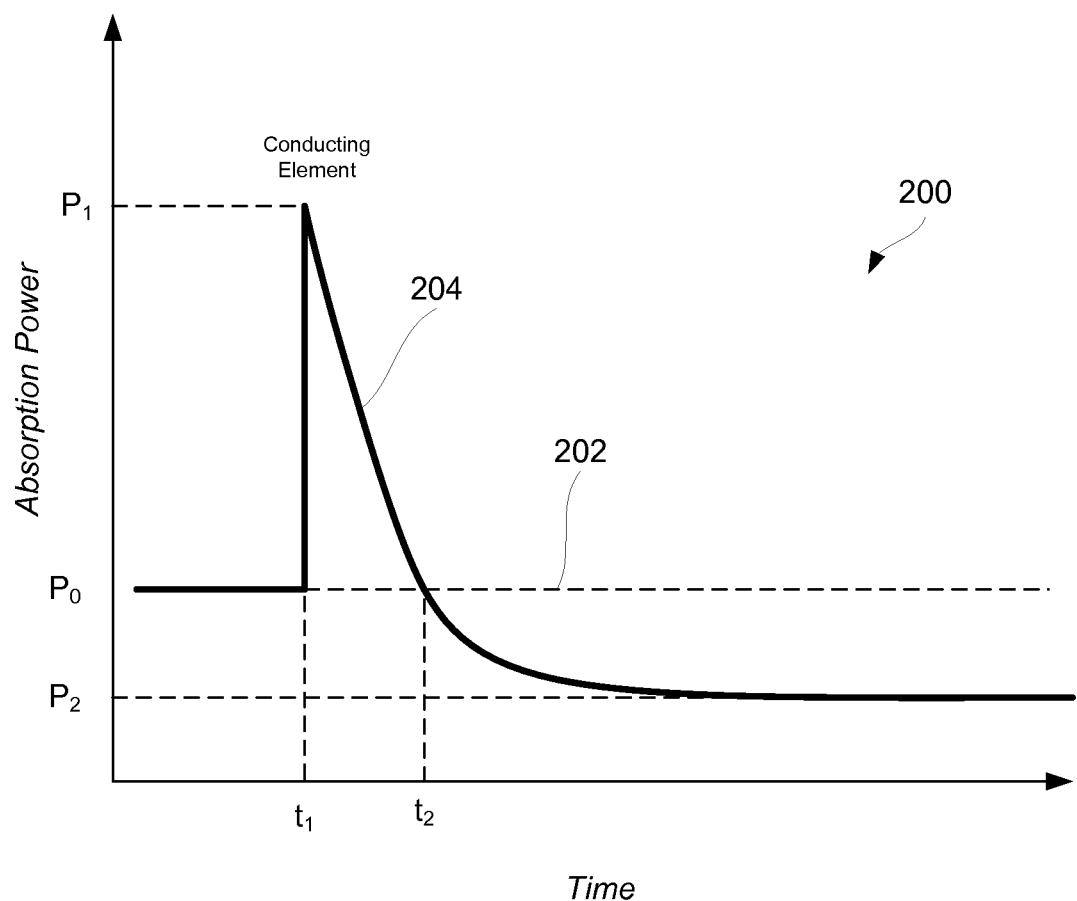
FIG. 2 is a schematic plot of a microwave absorption power as a function of a time for a superconducting circuit with a DC voltage applied between the superconducting element and the conducting element and for another circuit without any DC voltage applied, in accordance with some embodiments.

In some embodiments, the initial application of the DC voltage may cause a transient increase in the microwave absorption. The microwave absorption may eventually drop below the level at which no DC voltage is applied, and the average (over time) may be less than the level at which no DC voltage is applied. FIG. 2 is a schematic plot 210 of a microwave absorption power as a function of a time for a superconducting circuit with a DC voltage applied between the superconducting element and the conducting element (line 204) and for another circuit without any DC voltage applied (line 202), in accordance with some embodiments, measured at a constant intensity of microwave signal. In this example, the DC voltage is applied at time $t_1$, which cause the microwave absorption to jump from its level $P_0$ to level $P_1$. Level $P_0$ corresponds to the microwave absorption without any DC voltage (line 202), i.e., the no-bias level. After the initial increase in the microwave absorption from level $P_0$ to level $P_1$, the microwave absorption may start dropping and eventually reaching level $P_2$, which is lower than level $P_0$.

The transient increase (e.g., level $P_0$ to level $P_1$ in the above example) may be due to a redistribution of TLS state occupations and can be described as follows. Without being restricted to any particular theory, it is believed that in the presence of microwave field of given frequency $\omega$ and intensity I, the TLSs with energies E close to the resonant energy $\nabla\omega$ oscillate between the ground and the excited state. The oscillations cause occupation f of the ground state be reduced from f≈1.0 at I=0 to f≈0.5 at I→∞, which in turn limits absorption, which eventually saturates as I→∞. The initial microwave absorption level $P_0$ depends on the occupation f, which in turn depends on the intensity I of the microwave field. An application of a DC voltage changes the energies E of the TLSs, so that the TLSs previously at the resonant energy $\nabla\omega$ shift in energy and no longer give an appreciable contribution to microwave absorption, whereas some TLSs previously away from the resonant energy $\nabla\omega$ can shift towards the resonant energy and start contributing to absorption. Before the application of the DC voltage, the TLSs with energies away from the resonant energy are mostly in the ground state, f≈1.0. Immediately after the application of the DC voltage, the occupation of the TLSs brought to the resonant energy remains near f≈1.0, leading to the increased absorption level $P_1$. Upon relaxation of the occupation of the TLSs, the new equilibrium absorption level $P_2$ is reached. The level $P_2$ can be different from the level $P_0$ if the number of the TLSs brought into the resonance is different from the number of the TLSs brought away from the resonance.

In some embodiments, a process of determining a DC voltage for a superconducting circuit may first involve predicting the expected transient increase from the TLS contribution according to the mechanism described above. For example, when the DC voltage V is swept at a constant rate dV/dt, the transient increase in the microwave absorption can be estimated from the loss tangent predicted by a theoretical model. The process may then proceed with testing the superconducting circuit using different DC voltages by sweeping the voltages in a time-controlled manner V(t) while measuring the microwave absorption power. The process may then proceed with subtracting out the TLS contribution as predicted by the model described above for the given V(t) and P. The voltage resulting in the lowest absorption is selected. Alternatively, at each tested voltage value, the circuit may be given sufficient time to approach a steady state, e.g., level $P_2$ as shown in FIG. 2. The voltage resulting in the lowest absorption is selected. Alternatively, at each tested voltage value, the time-dependent absorption may be measured as it approaches a steady state, e.g., level $P_2$ as shown in FIG. 2, and the time dependence of the absorption is fitted to a theoretically or empirically established form, so that the steady state level $P_2$ can be deduced before the absorption fully reaches this level. The voltage resulting in the lowest absorption is selected.

Without being restricted to any particular theory, it is believed that the microwave absorption can be due to electronic defects in the vicinity of the Fermi level, e.g., within $\nabla\omega$ from the Fermi level, where w is the applied microwave radial frequency. The electronic defects can be directly related to structural defects. Furthermore, the microwave absorption can be due to atomic tunneling resulting in TLSs. This type of absorption may involve a change in a dipole moment and may be particularly strong when it is coupled to the change in localization of electrons in charged defect states (even for electronic defects that are far from the Fermi level. As a result, the microwave absorption can be due to atomic tunneling, such as tunneling between different atomic positions of a hydrogen impurity, or different local equilibrium positions of the amorphous network. The application of the DC voltage across the dielectric may differently affect the absorption contributions of different defect types. In some embodiments, the DC voltage may be tuned to minimize the cumulative absorption from all sources in the dielectric.

Specifically, by applying an electrical potential gradient, the local value of the Fermi level inside different portions of the dielectric is changed. Since the electronic states, which contribute to the absorption due to electronic defects in the vicinity of the Fermi level, have to be within $\nabla\omega$ from the local Fermi level, some defects are deactivated and others activated. Similarly, some charged defects contributing to the microwave absorption due to atomic tunneling resulting in TLSs may become uncharged (by changing the Fermi level position) and, thus, decrease the overall TLS absorption. At the same time, other neutral defects may become charged and, thus, increase the overall TLS absorption. The DC voltage may be selected for a specific superconducting circuit to manipulate the charge distribution among all the various defects in a way that produces a net decrease in the microwave absorption (compared to the no-bias state).

In some embodiments, structural defects may be concentrated in a certain location within the device, e.g., at an interface between two layers of different dielectric elements. Further, the energies of particular types of defects may be concentrated near a dominant value. For example, the electronic defect state created by a negatively charged dangling bond defect (i.e. a three-fold coordinated silicon) in hydrogenated amorphous silicon, a-Si:H, is believed to be located at about 0.8 . . . 0.9 eV below the conduction band. As such, by applying a DC voltage, the distribution of activity among the defects is altered and the microwave absorption can be minimized.

Superconducting Circuit Examples

Figure 1B:
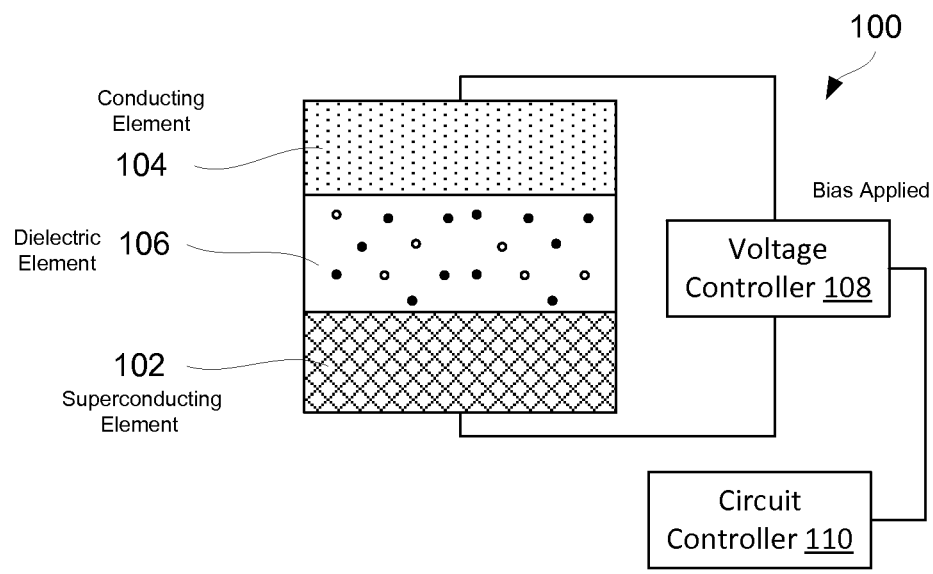

FIGS. 1A and 1B are schematic representations of a superconducting circuit 100 including a superconducting element 102, a conducting element 104, a dielectric element 106, and a voltage controller 108, in accordance with some embodiments. Dielectric element 106 is disposed between superconducting element 102 and conducting element 104. In some embodiments, dielectric element 106 directly interfaces one or both of superconducting element 102 and conducting element 104.

Voltage controller 108 is configured to apply a DC voltage between superconducting element 102 and conducting element 104. In some embodiments, voltage controller 108 may be communicatively coupled to a superconducting circuit controller 110. Superconducting circuit controller 110 may be responsible for controlling other functions of superconducting circuit 100 as well as applying a DC voltage between superconducting element 102 and conducting element 104. Conducting element 104 may be another superconducting element, a resonating element, or a conducting casing. In some embodiments, conducting element 104 is grounded.

Dielectric element 106 may include amorphous silicon, silicon oxide, aluminum oxide and other suitable materials. Dielectric element 106 may have a thickness of between about 30 nm and 10 mm. In amorphous materials, the structural defects can be due to the imperfections of the amorphous network, or sometimes can be caused by the specific forming method such as the amorphization of a crystalline material by plasma bombardment. Two-level systems can be due to hydrogen impurities, hydroxyl group impurities, and other impurities, that can be introduced either inadvertently during material deposition (e.g. as trapped precursor molecules during ALD deposition), or intentionally during or after deposition, such as hydrogen introduced into amorphous silicon to passivate structural defects.

In FIGS. 1A and 1B, the defects are shown with white and black dots within dielectric element 106. Specifically, white dots represent active defects, while black dots represent inactive defects. FIG. 1A represents a circuit with no bias applied across dielectric element 106. At this state, dielectric element 106 may have more active defects (white dots) than inaction defects (black dots) and dielectric element 106 would be responsible for some microwave adsorption. FIG. 1B represents a circuit with a bias applied across dielectric element 106. At this state, the inactive defects may become active defects (i.e., the black dots in FIG. 1A turned into white ones in FIG. 1B). Likewise, the active defects may become inactive defects (i.e., the white dots in FIG. 1A turned into black ones in FIG. 1B). Since there are fewer active defects in this new state (i.e., when the bias is applied), the microwave absorption may be less.

Examples of Operating Superconducting Circuits

Figure 3:
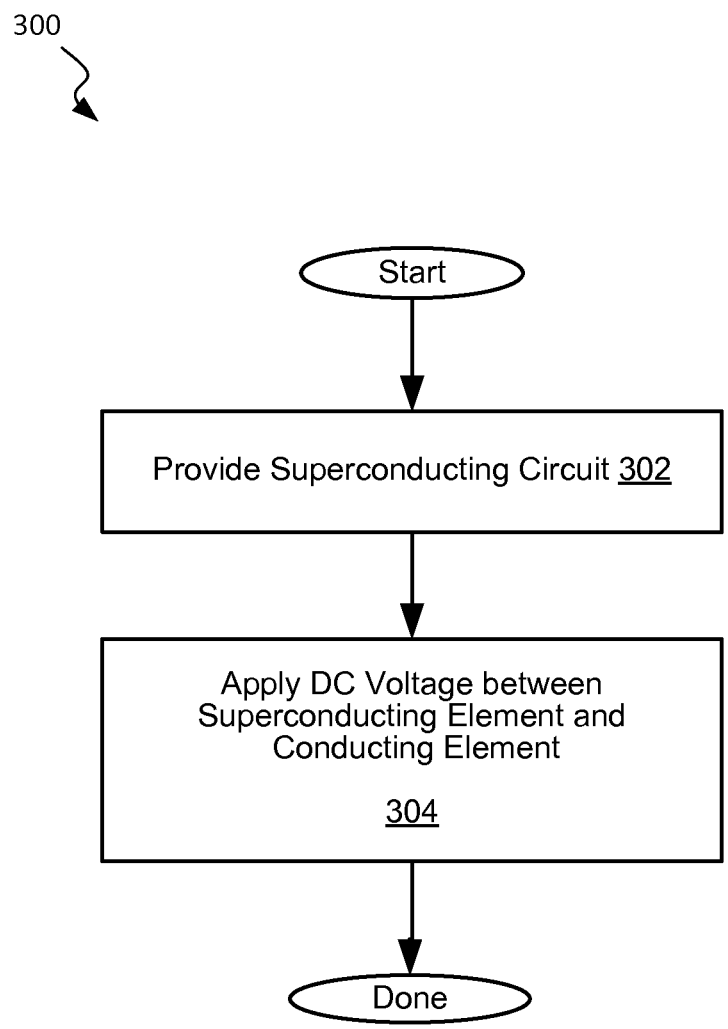
FIG. 3 is a process flowchart corresponding to a method of operating a superconducting circuit, in accordance with some embodiments.

FIG. 3 is a process flowchart corresponding to a method 300 of operating a superconducting circuit, in accordance with some embodiments. Method 300 may proceed with providing the superconducting circuit during operation 302. The superconducting circuit may include a superconducting element, a conducting element, and a dielectric element disposed between the superconducting element and the conducting element. Various examples of superconductor circuits are described above with reference to FIG. 1.

Method 300 may proceed with applying a DC voltage between the superconducting element and the conducting element during operation 304, e.g., while operating the superconducting circuit. For example, the DC voltage may be applies prior to operating the superconducting circuit. In some embodiments, the DC voltage is applied prior to operating the superconducting circuit.

Applying the DC voltage reduces the average microwave absorption of the dielectric element during operating the superconducting circuit as described above. In some embodiments, the absorption loss may initially jump to a higher level, and then decline to a lower level than when no DC voltage is applied.

The DC voltage applied during operation 304 may be between about 0.005 Volts and 5 Volts, or more specifically between 0.1 Volts and 0.5 Volts. In some embodiments, the magnitude of the DC voltage is selected based on one or more of a type of the structural defects and distribution of the structural defects within the dielectric element. In some embodiments, the DC voltage is established experimentally for each specific type of circuit formed by each specific deposition and processing sequence.

Examples of Determining Processing Conditions

Figure 4:
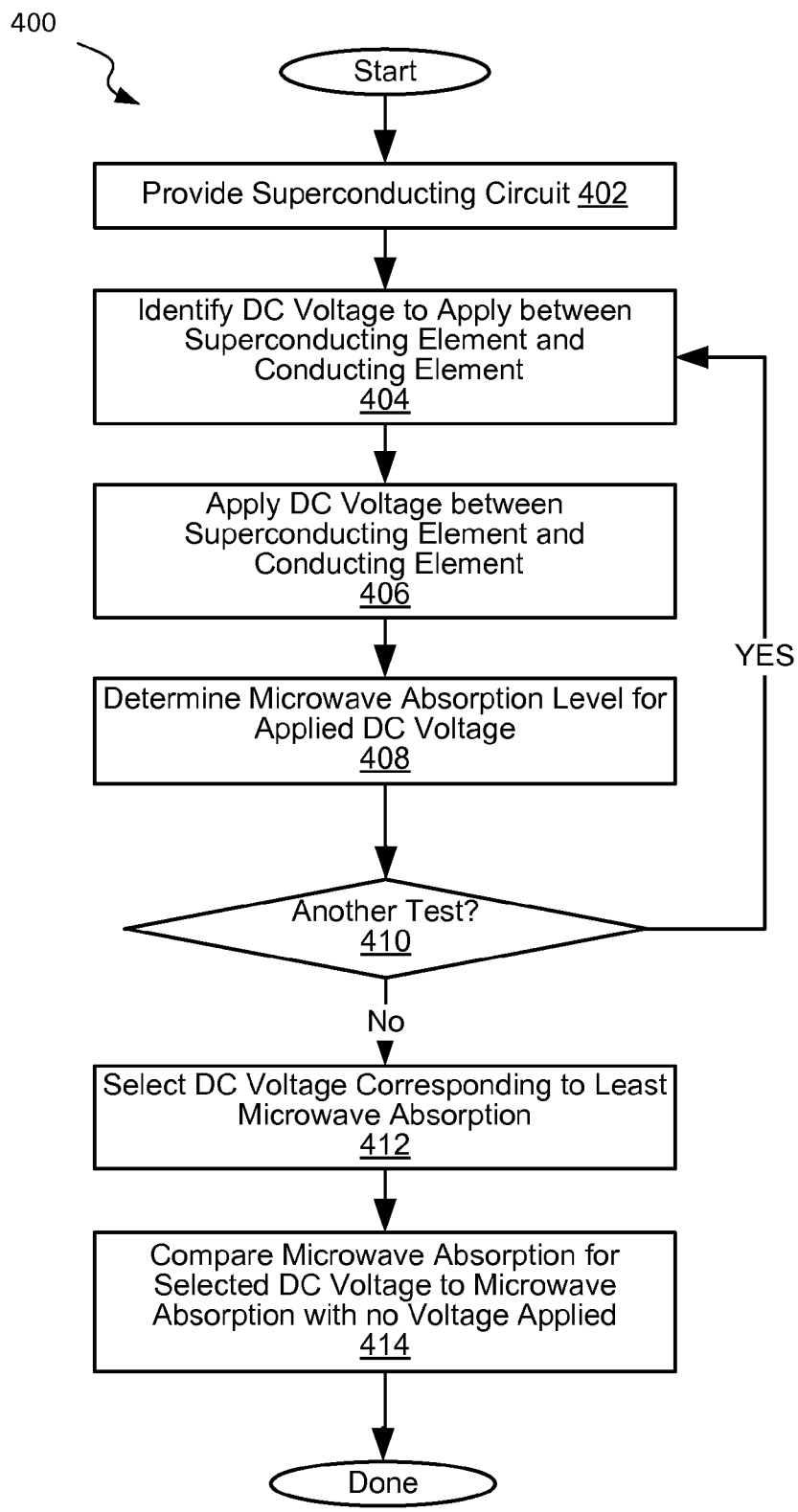
FIG. 4 is a process flowchart corresponding to a method of determining processing conditions for operating a superconducting circuit, in accordance with some embodiments.

FIG. 4 is a process flowchart corresponding to a method 400 of determining operating conditions for operating a superconducting circuit with a conducting element to selectively neutralize dielectric defects, in accordance with some embodiments. Method 400 may start with providing the superconducting circuit during operation 402. The superconducting circuit includes a superconducting element, a conducting element, and a dielectric element disposed between the superconducting element and the conducting element. Various examples of superconducting circuits are described above with reference to FIG. 1.

Method 400 may proceed with operation 404, during which a DC voltage for applying between the superconducting element and the conducting element is identified. The DC voltage may be identified based on the particular circuit design, previous data, previous test (e.g., a loop created by decision block 410), voltage scanning schedules, and other technique.

Method 400 may proceed with applying the identified DC voltage between the superconducting element and the conducting element during operation 406. Operation 406 is performed, e.g., while operating the superconducting circuit. Method 400 may proceed with determining a level of microwave absorption by the dielectric element corresponding to the applied DC voltage during operation 408. In some embodiments, the level of microwave absorption is a timed averaged of microwave absorption.

In some embodiments, method 400 involves repeatedly applying the DC voltage operation 406 and determining the level of microwave absorption operation 408 at least once as indicated by decision block 410. The repeated operations are performed using a different level of the DC voltage identified in operation 404.

Method 400 may proceed with selecting a level of the DC voltage corresponding to a lowest level of microwave absorption during operation 412. Furthermore, method 400 may involve operation 414, during which the lowest level of microwave absorption is compared to the level of microwave absorption without any DC voltage applied. This operation may be referred to as a benchmark comparison. In some example, applying no DC voltage between the superconducting element and the conducting element may yield the lowest level of microwave absorption.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:
1. A method comprising:
providing a superconducting circuit,
wherein the superconducting circuit comprises a superconducting element, a conducting element, and a dielectric element disposed between the superconducting element and the conducting element; and
applying a direct current (DC) voltage between the superconducting element and the conducting element;
wherein the dielectric element comprises structural defects; and
wherein the applying of the DC voltage reduces a microwave absorption of the dielectric element.
2. The method of claim 1, wherein applying the DC voltage initially increases the microwave absorption of the dielectric element; and wherein the microwave absorption of the dielectric element subsequently decreases.
3. The method of claim 1, wherein a value of the DC voltage is selected based on one or more of a type of the structural defects and a distribution of the structural defects within the dielectric element.
4. The method of claim 1, wherein the DC voltage is applied for a period of time prior to operating the superconducting element.

5. The method of claim 1, wherein the conducting element comprises one of an additional superconducting element, a resonating element, or a conducting casing.
6. The method of claim 1, wherein the dielectric element comprises at least one of silicon oxide, amorphous silicon, or aluminum oxide.
7. The method of claim 1, wherein the DC voltage is between about 0.005 Volts and 5 Volts.
8. The method of claim 1, wherein the dielectric element has a thickness of between about 30 nanometers and 10 millimeters.
9. The method of claim 1, wherein the conducting element is grounded.
10. The method of claim 1, wherein the applying of the DC voltage comprises a voltage sweep.
11. A superconducting circuit comprising:
a superconducting element;
a conducting element;
a dielectric element; and
a voltage controller,
wherein the dielectric element is disposed between the superconducting element and the conducting element;
wherein the dielectric element comprises structural defects; and
wherein the voltage controller is connected to apply a direct current (DC) voltage between the superconducting element and the conducting element at least when the superconducting element is operating.
12. The superconducting circuit of claim 1, wherein the voltage controller is communicatively coupled to a system controller used to operate a superconducting circuit.
13. The superconducting circuit of claim 1, wherein the conducting element comprises one of an additional superconducting element, a resonating element, or a conducting casing.
14. The superconducting circuit of claim 1, wherein the dielectric element comprises amorphous silicon, silicon oxide, or aluminum oxide.
15. The superconducting circuit of claim 1, wherein the dielectric element has a thickness of between about 30 nanometers and 10 millimeters.
16. A method comprising:
providing a superconducting circuit, wherein the superconducting circuit comprises a superconducting element, a conducting element, and a dielectric element disposed between the superconducting element and the conducting element;
applying a first level of direct current (DC) voltage between the superconducting element and the conducting element;
determining a first level of microwave absorption in the dielectric element corresponding to the first level of the DC voltage;
applying a second level of the DC voltage between the superconducting element and the conducting element;
determining a second level of microwave absorption in the dielectric element corresponding to the second level of the DC voltage; and
selecting a level of the DC voltage corresponding to a lowest level of microwave absorption;
wherein the dielectric element comprises structural defects.
17. The method of claim 16, further comprising comparing the lowest level of microwave absorption to a baseline level of microwave absorption observed when no DC voltage is applied between the superconducting element and the conducting element.

18. The method of claim 16, wherein the microwave absorption reaches a steady state after applying the DC voltage.

19. The method of claim 16, wherein the dielectric element comprises amorphous silicon, silicon oxide or aluminum oxide.

20. The method of claim 16, wherein the dielectric element has a thickness of between about 30 nanometers and 10 millimeters.

* * * * *